United States Patent
Chou

(10) Patent No.: US 10,637,174 B2
(45) Date of Patent: Apr. 28, 2020

(54) ELASTOMER STRUCTURE OF CONDUCTIVITY PROBE

(71) Applicant: Ting Chou, Changhua (TW)

(72) Inventor: Ting Chou, Changhua (TW)

( * ) Notice: Subject to any disclaimer, the term of this patent is extended or adjusted under 35 U.S.C. 154(b) by 0 days.

(21) Appl. No.: 16/181,323

(22) Filed: Nov. 5, 2018

(65) Prior Publication Data

US 2019/0157789 A1  May 23, 2019

(30) Foreign Application Priority Data

Nov. 23, 2017 (CN) .................. 2017 2 1586494 U

(51) Int. Cl.
| | | |
|---|---|---|
| *H01R 13/24* | (2006.01) | |
| *G01R 1/067* | (2006.01) | |
| *H05K 5/00* | (2006.01) | |
| *G01R 1/073* | (2006.01) | |

(52) U.S. Cl.
CPC ..... *H01R 13/2421* (2013.01); *G01R 1/06722* (2013.01); *H05K 5/00* (2013.01); *G01R 1/07357* (2013.01); *H01R 13/2414* (2013.01); *H01R 13/2485* (2013.01); *H01R 2201/20* (2013.01)

(58) Field of Classification Search
CPC ............ H01R 13/2421; H01R 13/2414; H01R 13/2485; H01R 2201/20; H01R 12/00; H01R 12/52; H01R 13/2435; G01R 1/06722; G01R 1/07357
USPC ................... 439/86, 65, 66, 74, 91
See application file for complete search history.

(56) References Cited

U.S. PATENT DOCUMENTS

| | | | | |
|---|---|---|---|---|
| 6,043,666 A * | 3/2000 | Kazama | ............ | G01R 1/06722 324/755.05 |
| 6,720,511 B2 * | 4/2004 | Windebank | ............ | H01H 1/245 200/275 |
| 6,846,184 B2 * | 1/2005 | Fan | .................... | H01R 13/2421 439/66 |
| 6,974,332 B2 * | 12/2005 | Ma | ..................... | H01R 13/2421 439/66 |
| 7,404,717 B2 * | 7/2008 | Kazama | ............ | H01R 13/2421 439/66 |
| 8,029,291 B2 * | 10/2011 | Park | ......................... | B21F 3/02 439/66 |
| 8,118,604 B2 * | 2/2012 | Ma | ..................... | H01R 13/2435 439/66 |
| 8,610,447 B2 * | 12/2013 | Lee | .................... | G01R 1/06722 324/756.02 |
| 9,225,095 B2 * | 12/2015 | Van Ekstrom | ..... | H01R 13/2421 |
| 9,306,308 B2 * | 4/2016 | Kim | .................... | H01R 13/2421 |
| 2004/0147140 A1 * | 7/2004 | Fan | .................... | H01R 13/2421 439/66 |
| 2004/0239356 A1 * | 12/2004 | Kazama | ................ | C23C 28/023 324/754.14 |
| 2005/0250354 A1 * | 11/2005 | Vinther | ............. | G01R 1/06722 439/66 |

* cited by examiner

*Primary Examiner* — Travis S Chambers
(74) *Attorney, Agent, or Firm* — Chun-Ming Shih

(57) ABSTRACT

An elastomer structure of a conductivity probe contains: an elastic body configured to transmit electronic currents and electronic signals. The elastic body includes a first transceiver portion formed on a first free end thereof, a second transceiver portion formed on a second free end thereof, and a resilient section surrounding between the first transceiver portion and the second transceiver portion. Preferably, at least one of the first and second transceiver portions has a plane.

1 Claim, 4 Drawing Sheets

ELASTOMER STRUCTURE OF CONDUCTIVITY PROBE

FIELD OF THE INVENTION

The present invention relates to an elastomer structure of a conductivity probe which is configured to transmit electronic currents and electronic signals.

BACKGROUND OF THE INVENTION

A conventional probe has been widely used in testing electronic currents and signals of printed circuit boards, wafers, IC packaging, communication products, and liquid crystal panels for testing. In addition, the probe size is more and more fine and has advantages of conductivity and low resistance, so the probe has high-frequency signal transmission and can be used as a transceiver antenna and various types of electronic products for mobile phones and other wireless communication products. However, the probe is complicated and has a large size and a high resistance value.

Referring to FIG. 1, a conventional probe contains an elastomer body 1a, and the elastomer body 1a has two transceiver portions 2a formed on two free ends thereof respectively and configured to contact with a signal starting end 21a (such as a position of a substrate of the probe card) and a signal terminal end 22a (such as a solder ball soldered on a back side of an integrated circuit board).

When transmitting the electronic signals, two arcuate ends of two transceiver portions 2a contact with the signal starting end 21a and the signal terminal end 22a respectively, thus lowering signal transmission stability, increasing electric resistance, and raising inductive effect.

The present invention has arisen to mitigate and/or obviate the afore-described disadvantages.

SUMMARY OF THE INVENTION

The primary objective of the present invention is to provide an elastomer structure of a conductivity probe which enhances signal transmission stability, decreases electric resistance, and eliminates inductive effect.

To obtain above-mentioned object, the elastomer structure of the conductivity probe provided by the present invention contains: an elastic body configured to transmit electronic currents and electronic signals. The elastic body includes a first transceiver portion formed on a first free end thereof, a second transceiver portion formed on a second free end thereof, and a resilient section surrounding between the first transceiver portion and the second transceiver portion. Preferably, at least one of the first and second transceiver portions has a plane.

Preferably, each of the first and second transceiver portions has multiple coils surrounding therearound, wherein the multiple coils matingly contact with or separates from one another.

Preferably, the first transceiver portion has the plane.
Preferably, the second transceiver portion has the plane.
Preferably, each of the first and second transceiver portions has the plane.

DETAILED DESCRIPTION OF THE PREFERRED EMBODIMENTS

Figure 1:
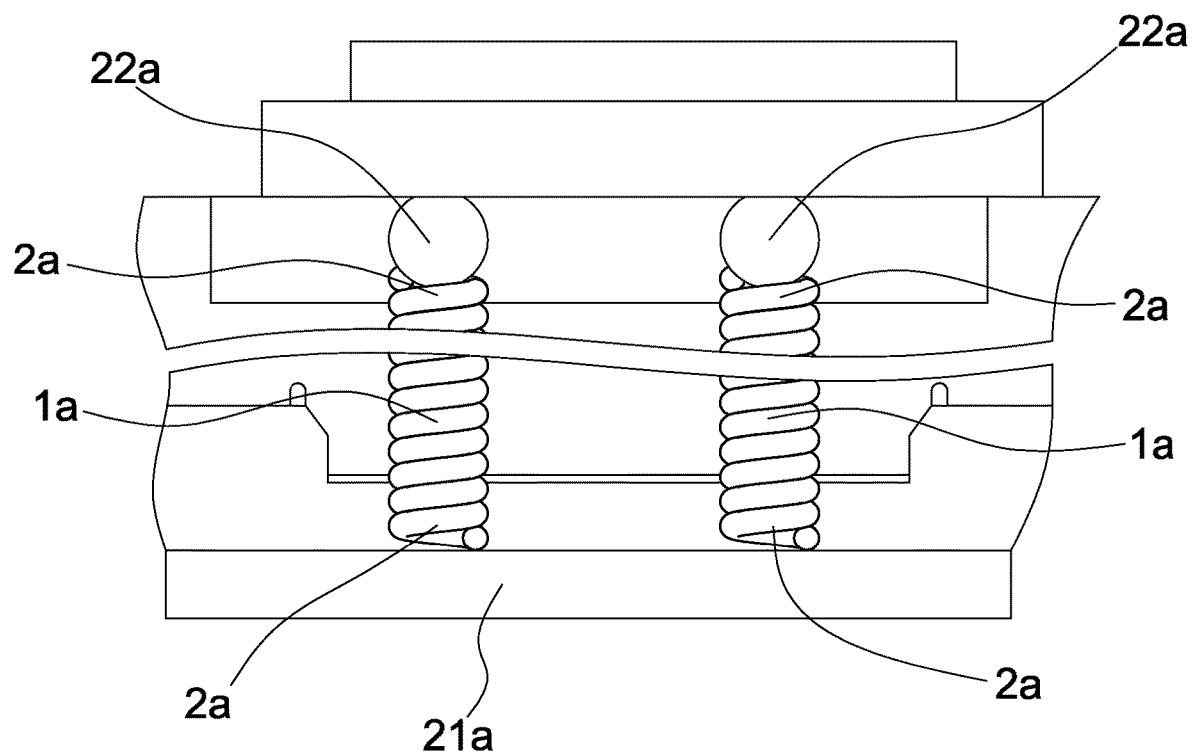
FIG. 1 is a schematic view showing the application of a conventional conductivity probe.
Figure 2:
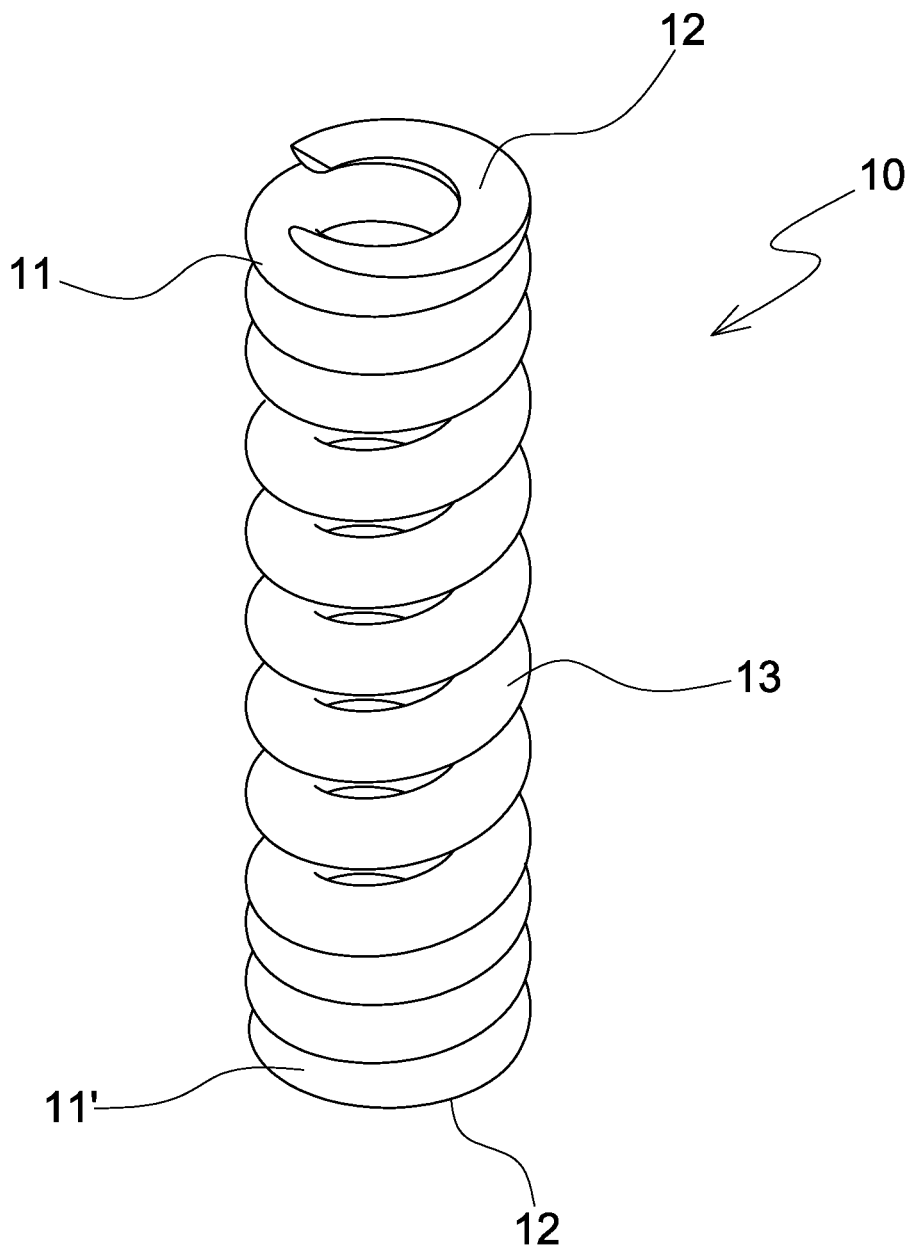
FIG. 2 is a perspective view showing the assembly of an elastomer structure of a conductivity probe according to a preferred embedment of the present invention.
Figure 3:
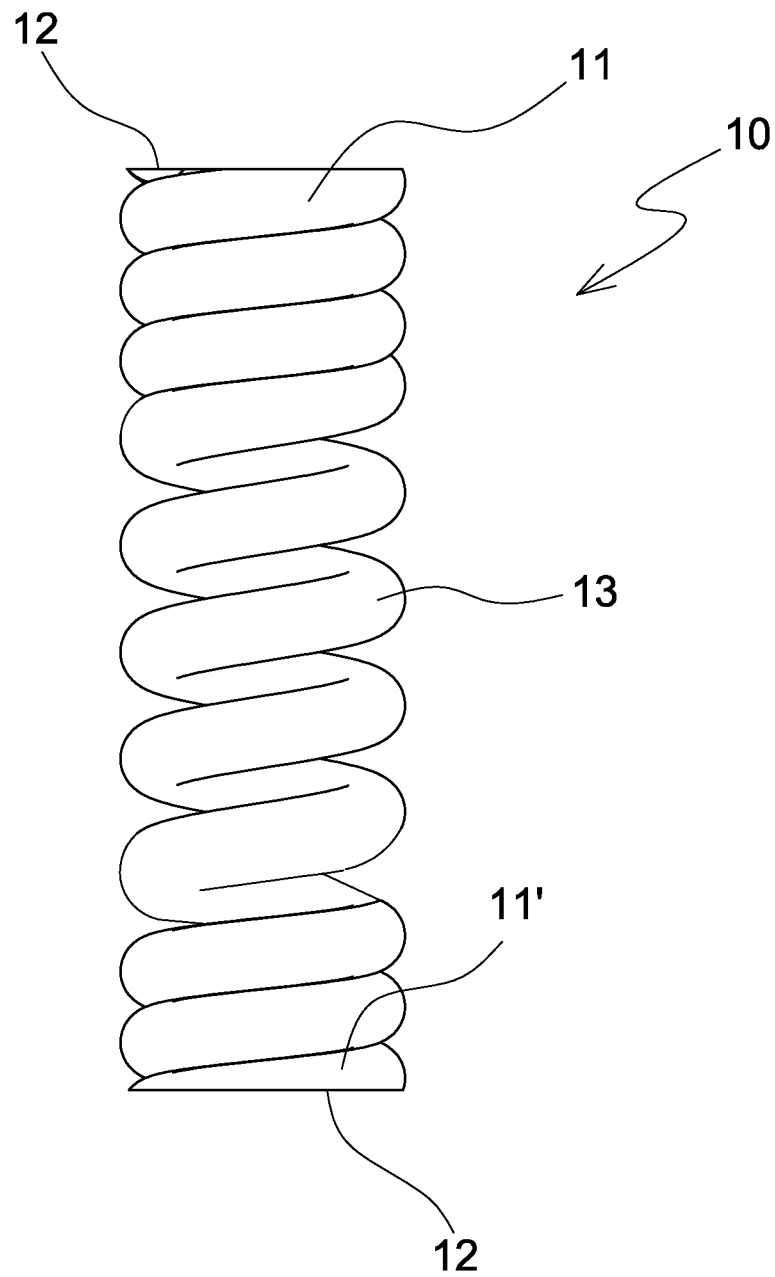
FIG. 3 is a side plane view showing the assembly of the elastomer structure of the conductivity probe according to the preferred embedment of the present invention.
Figure 4:
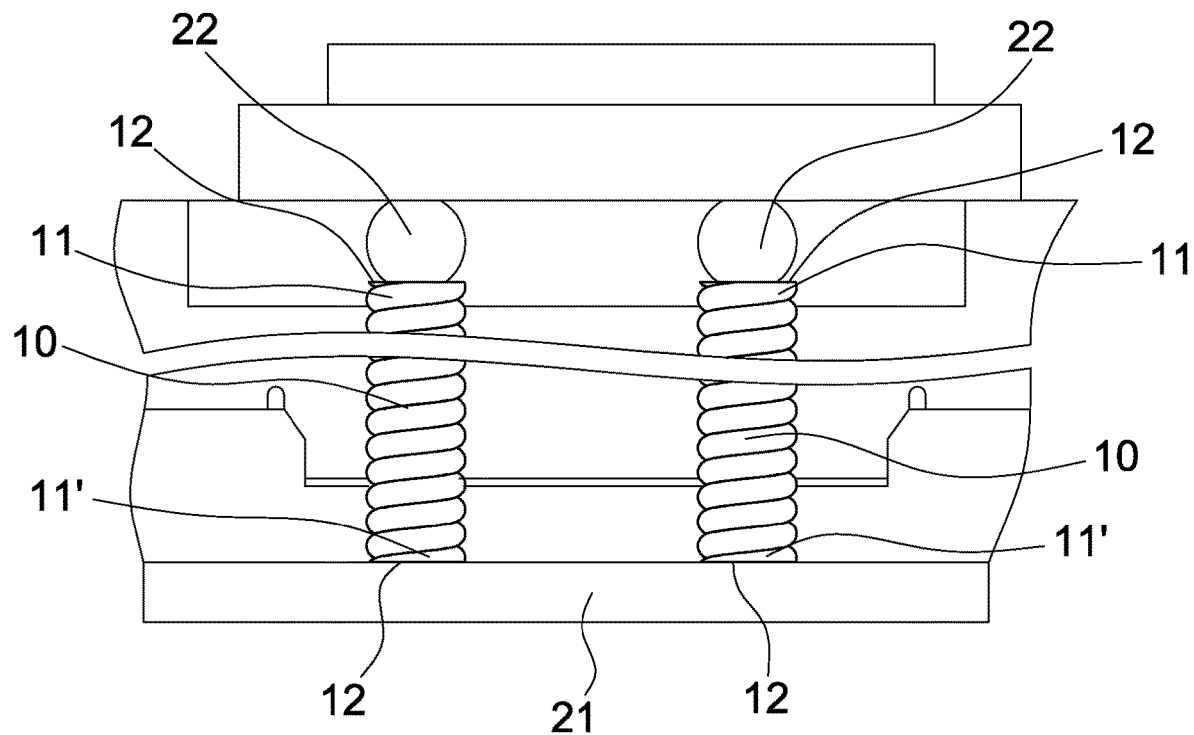
FIG. 4 is a side plan view showing the application of the elastomer structure of the conductivity probe according to the preferred embedment of the present invention.

With reference to FIGS. 2-4, an elastomer structure of a conductivity probe according to a preferred embodiment of the present invention comprises:

an elastic body 10 configured to transmit electronic currents and electronic signals, and the elastic body 10 includes a first transceiver portion 11 formed on a first free end thereof, a second transceiver portion 11' formed on a second free end thereof, and a resilient section 13 surrounding between the first transceiver portion 11 and the second transceiver portion 11', wherein each of the first and second transceiver portions 11, 11' has an arcuate distal end which is plane ground to produce a plane 12.

Preferably, each of the first and second transceiver portion 11, 11' has multiple coils surrounding therearound, wherein the multiple coils matingly contact with or separates from one another.

In another embodiment, the first transceiver portion 11 or the second transceiver portion 11' has the plane 12.

Referring to FIG. 4, the conductivity probe is placed on an interface mechanism (such as a probe card configured to test wafers) configured to transmit the electronic signals, wherein the first and second transceiver portions 11, 11' of the body 10 respectively contact with a signal starting end 21 (such as a position of a substrate of the probe card) and a signal terminal end 22 (such as a solder ball soldered on a back side of an integrated circuit board). When transmitting the electronic signals, the multiple coils of the body 10 are presses to contact with one another so as to transmit the electronic signals quickly. Because each of the first and second transceiver portions 11, 11' has the plane 12, the plane 12 contacts with each of the signal starting end 21 and the signal terminal end 22 with a large size, thus enhancing transmission stability, decreasing electric resistance, and eliminating inductive effect.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An elastomer structure of a conductivity probe comprising: an elastic body configured to transmit electronic currents and electronic signals, and the elastic body including a first transceiver portion formed on a first free end thereof, a second transceiver portion formed on a second free end thereof, and a resilient section defined between the first transceiver portion and the second transceiver portion;
   wherein each of the first and second transceiver portions has a plane;
   wherein the plane of each of the first and second transceiver portions contacts with each of a signal starting end and a signal terminal end with a large size;

wherein multiple coils are defined between the first and second transceiver portions, and the multiple coils matingly contact with one another;

wherein when transmitting the electronic signals, the multiple coils of the elastic body are pressed to contact with one another matingly;

wherein inner diameters of the multiple coils are equal to one another.

\* \* \* \* \*